US006775816B2

(12) United States Patent
Sato et al.

(10) Patent No.: US 6,775,816 B2
(45) Date of Patent: Aug. 10, 2004

(54) SEMICONDUCTOR DESIGN/FABRICATION SYSTEM, SEMICONDUCTOR DESIGN/FABRICATION METHOD AND SEMICONDUCTOR DESIGN/FABRICATION PROGRAM

(75) Inventors: Yoshiyuki Sato, Tokyo (JP); Shigeki Sugimoto, Tokyo (JP); Tatsuo Akiyama, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 44 days.

(21) Appl. No.: 10/327,114

(22) Filed: Dec. 24, 2002

(65) Prior Publication Data

US 2003/0121016 A1 Jun. 26, 2003

(30) Foreign Application Priority Data

Dec. 26, 2001 (JP) ........................................ 2001-394884

(51) Int. Cl.⁷ .............................................. G06F 17/50
(52) U.S. Cl. .............................. 716/19; 716/20; 716/21
(58) Field of Search ............................. 716/4–6, 19–21; 702/81–84, 118, 179, 181, 185; 703/14–16; 257/503; 364/488–491, 578, 468.17; 382/149; 324/718; 700/108–110, 121

(56) References Cited

U.S. PATENT DOCUMENTS

| 5,128,737 A | * | 7/1992 | van der Have | 257/503 |
| 5,539,652 A | * | 7/1996 | Tegethoff | 703/14 |
| 5,655,110 A | * | 8/1997 | Krivokapic et al. | 716/19 |
| 6,066,179 A | * | 5/2000 | Allan | 716/4 |
| 2003/0050761 A1 | * | 3/2003 | Okabe et al. | 702/82 |

FOREIGN PATENT DOCUMENTS

JP          11-176944          7/1999

OTHER PUBLICATIONS

Allan et al. "Efficient critical area algorithms and their application to yield improvement and test strategies", 1994 Proceedings o the IEEE International Workshop on Defect and fault Tolerance in VLSI Systems, pp. 88–96, Jan. 1, 1994).*

C.H. Stapper and R.J. Rosner, "Integrated Circuit Yield Management and Yield Analysis: Development and Implementation", IEEE Transactions on Semiconductor Manufacturing, 1995, vol. 8(2), May 1995, pp. 95–102.*

(List continued on next page.)

*Primary Examiner*—Vuthe Siek
*Assistant Examiner*—Naum Levin
(74) *Attorney, Agent, or Firm*—Oblon, Spivak, McClelland, Maier & Neustadt, P.C.

(57) ABSTRACT

A semiconductor design/fabrication system which combines a plurality of function blocks and arranges the combined function blocks on a chip, comprising: a function block selector which selects the function blocks to be arranged on the same chip from a plurality of function blocks for each of which a critical area indicating a range where defective products occur due to existence of defects is known; a chip information calculator which calculates a sum of the critical areas on each of the selected function blocks; an yield calculator which calculates an yield based on a calculation result of the chip information calculator and defect occurrence rate information of a chip fabrication line; a cost delivery time information calculator which calculates information relating to fabrication cost and delivery time of the chip based on a calculation result of the yield calculator and fabrication management information relating to cost and fabrication period of the chip fabrication line; and a combination selector which selects a combination of the function blocks constituting the chip based on the information relating to the fabrication cost and the delivery time of the chip calculated by the cost delivery time information calculator.

20 Claims, 6 Drawing Sheets

OTHER PUBLICATIONS

G.A. Allan and A.J. Walton, "Hierarchical Critical Area Extraction with the EYE tool", IEEE Workshop on Defect and Fault Tolerance in VLSI Systems, Lafayette, Louisiana, 1995, pp. 28–36.*

P.K. Nag and W. Maly, "Hierarchical Extraction of Critical Area for Shorts in very large scale ICs", IEEE Workshop on Defect an Fault Tolerance in VLSI Systems, 1995, Lafayette, Louisiana, pp. 19–27, Jan. 1, 1995.*

H.T. Heineken and W. Maly, "Manufacturability analysis environment—MAPEX", Custom Integrated Circuits Conference, San Diego, CA, 1994, pp. 309–312, Jan. 1994.*

U.S. patent application Ser. No. 09/931,091, Noda et al., filed Aug. 17, 2001.

U.S. patent application Ser. No. 10/327,114, Sato et al., filed Dec. 24, 2002.

* cited by examiner

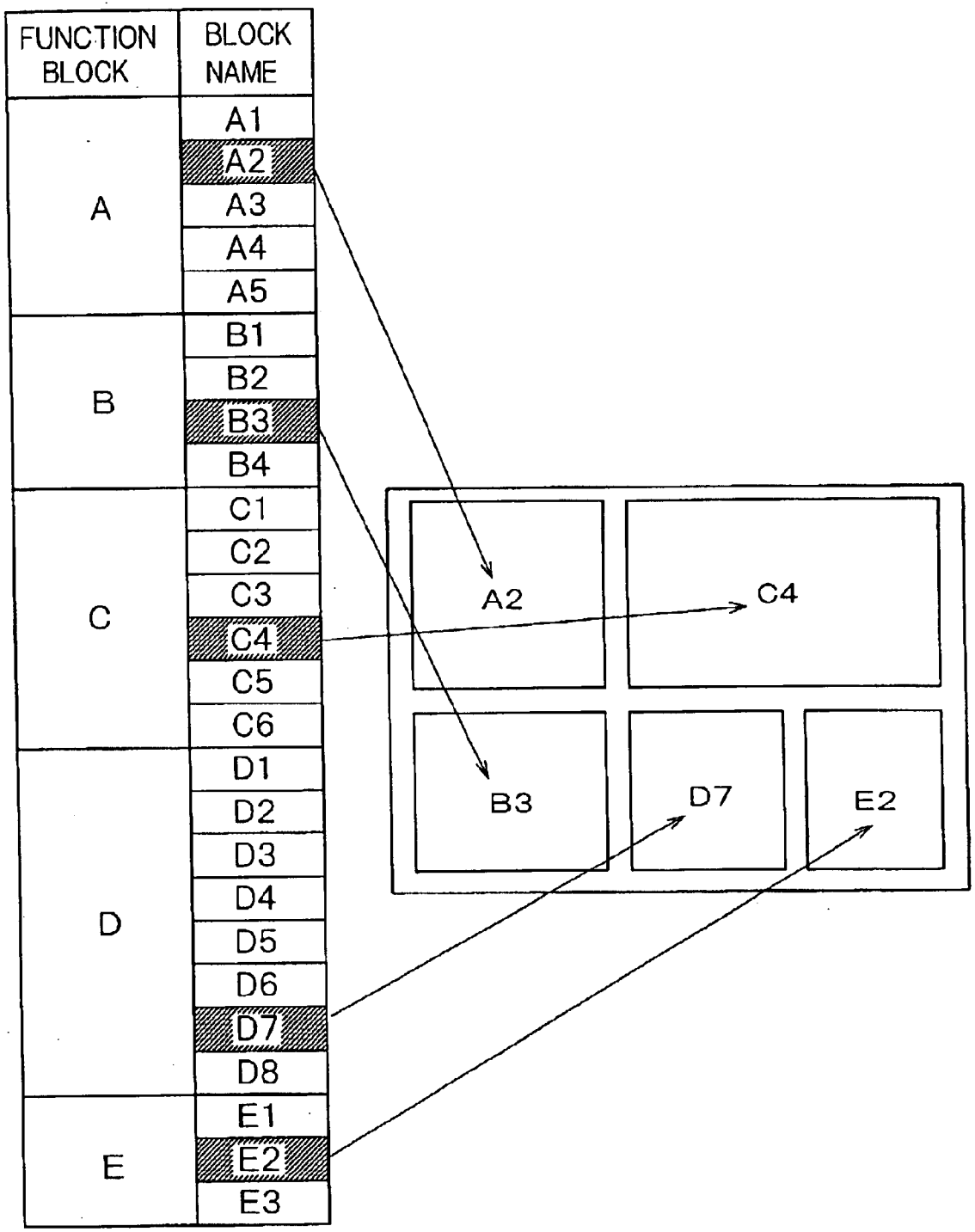
F I G. 6

| Chip | BLOCK CONFIGURATION | Chip Size | Gross | FORECAST YIELD | THE NUMBER OF NON-DEFECTIVE CHIPS/WAFER | COST/ WAFER | COST/NON-DEFECTIVE CHIP | DAY/ WAFER | DAY/NON-DEFECTIVE CHIP |
|---|---|---|---|---|---|---|---|---|---|
| COMBINATION 1 | A2+B3+⋯+E2 | 5000 | 200 | 50% | 100 | 300000 | 3000 | 30 | 0.30 |
| COMBINATION 2 | A2+B3+⋯+E2 | 6000 | 167 | 63% | 105 | 280000 | 2667 | 30 | 0.29 |
| COMBINATION 3 | A2+B3+⋯+E2 | 8000 | 125 | 66% | 83 | 210000 | 2530 | 30 | 0.36 |
| COMBINATION 4 | A2+B3+⋯+E2 | 10000 | 100 | 71% | 71 | 200000 | 2817 | 30 | 0.42 |
| . | . | . | . | . | . | . | . | . | . |

| FABRICATION LINE | CHIP | THE NUMBER OF CHIPS CAPABLE OF FABRICATING BY DELIVERY TIME DESIRED BY USER | SHORTEST DELIVERY TIME | CHIP COST | |
|---|---|---|---|---|---|
| Fab. X | COMBINATION 1 | 15000 | October 5 | 7000 | |
| | COMBINATION 2 | 14000 | October 7 | 6500 | |
| | COMBINATION 3 | 13000 | October 9 | 6000 | ←1 |
| Fab. Y | COMBINATION 1 | 8000 | October 16 | 5500 | |
| | COMBINATION 2 | 7000 | October 19 | 5300 | |
| | COMBINATION 3 | 6000 | October 22 | 5000 | ←2 |
F I G. 9
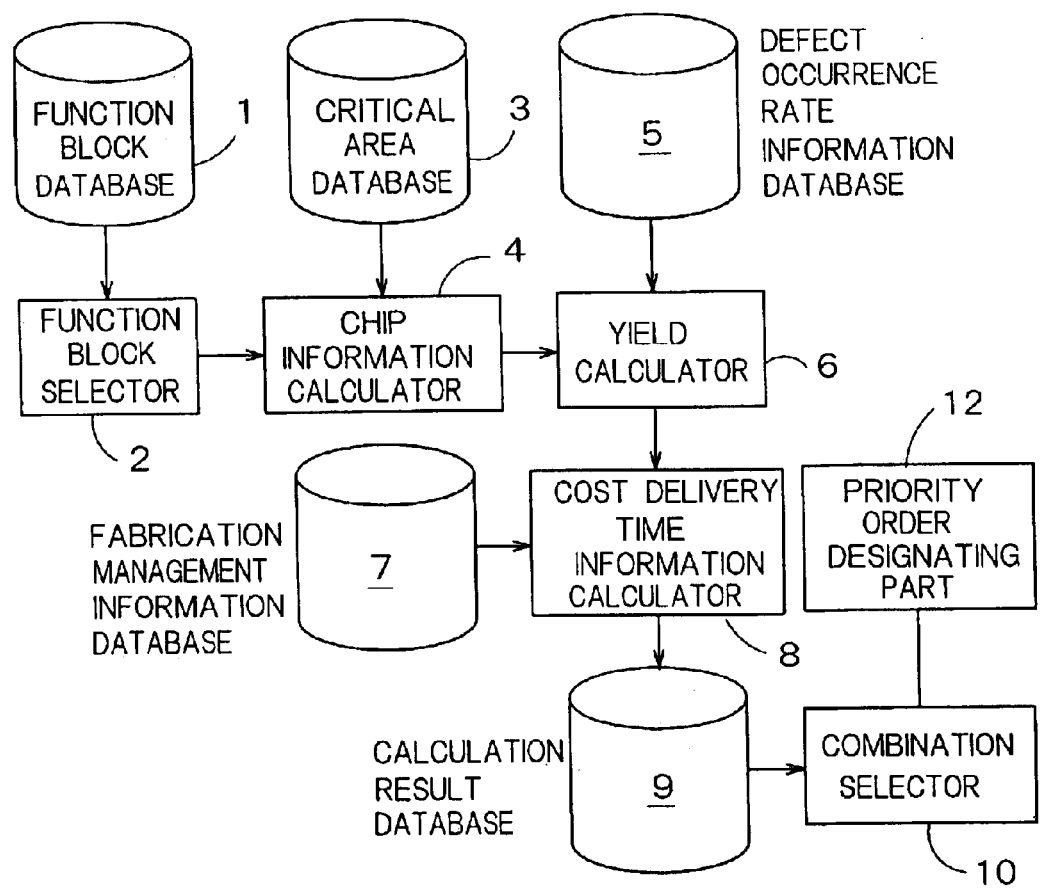
F I G. 10

US 6,775,816 B2

SEMICONDUCTOR DESIGN/FABRICATION SYSTEM, SEMICONDUCTOR DESIGN/FABRICATION METHOD AND SEMICONDUCTOR DESIGN/FABRICATION PROGRAM

CROSS REFERENCE TO RELATED APPLICATIONS

This application is based upon and claims the benefit of priority from the prior Japanese Patent Applications No. 2001-394884, filed on Dec. 26, 2001, the entire contents of which are incorporated herein by reference.

BACKGROUND OF THE INVENTION

1. Field of the Invention

The present invention relates to a semiconductor design/fabrication system, a semiconductor design/fabrication method and a semiconductor design/fabrication program which selects arbitrary function blocks from a plurality of function blocks and arranges the selected function blocks on a chip.

2. Related Background Art

It takes too much time and cost to develop an LSI chip from scratch. Because of this, design method in which desirable function blocks are selected if necessary from a plurality of function blocks that operational verification has already been done, and the selected function blocks are arranged on the chip, is generally adopted.

Request for the chips is vary by each user. For example, one user requests chip cost reduction, the other user requests short delivery time even if cost is somewhat high, or the other user requests reduction of defective rate.

Even when the function blocks are combined and arranged on the chip, an yield and a fabrication cost are largely affected by the types of the selected function blocks and how to arrange the function blocks.

However, the method of selecting the optimum combination of the function blocks in accordance with user's request has not been conventionally established. Because of this, user had to combine the function blocks by cut and try, and arrange the combined function blocks on the chip to verify them. Accordingly, there was a problem in which it takes time to find the optimum combination of the function blocks.

SUMMARY OF THE INVENTION

A semiconductor design/fabrication system according to one embodiment of the present invention which combines a plurality of function blocks and arranges the combined function blocks on a chip, comprising:

a function block selector which selects the function blocks to be arranged on the same chip from a plurality of function blocks for each of which a critical area indicating a range where defective products occur due to existence of defects is known;

a chip information calculator which calculates a sum of said critical areas on each of the selected function blocks;

an yield calculator which calculates an yield based on a calculation result of said chip information calculator and defect occurrence rate information of a chip fabrication line;

a cost delivery time information calculator which calculates information relating to fabrication cost and delivery time of the chip based on a calculation result of said yield calculator and fabrication management information relating to cost and fabrication period of the chip fabrication line; and a combination selector which selects a combination of the function blocks constituting the chip based on the information relating to the fabrication cost and the delivery time of the chip calculated by said cost delivery time information calculator.

BRIEF DESCRIPTION OF THE DRAWINGS

FIG. 6 is a diagram showing an example of selection of the function blocks.

FIG. 9 is a diagram showing information stored in the calculation result database.

FIG. 10 is a block diagram showing schematic configuration of a semiconductor design/fabrication system according to a third embodiment of the present invention.

DESCRIPTION OF THE PREFERRED EMBODIMENTS

Hereinafter, a semiconductor design/fabrication system, a semiconductor design/fabrication method and a semiconductor design/fabrication program according to embodiments of the present invention will be more specifically described with reference to drawings.

(First Embodiment)

Figure 1:
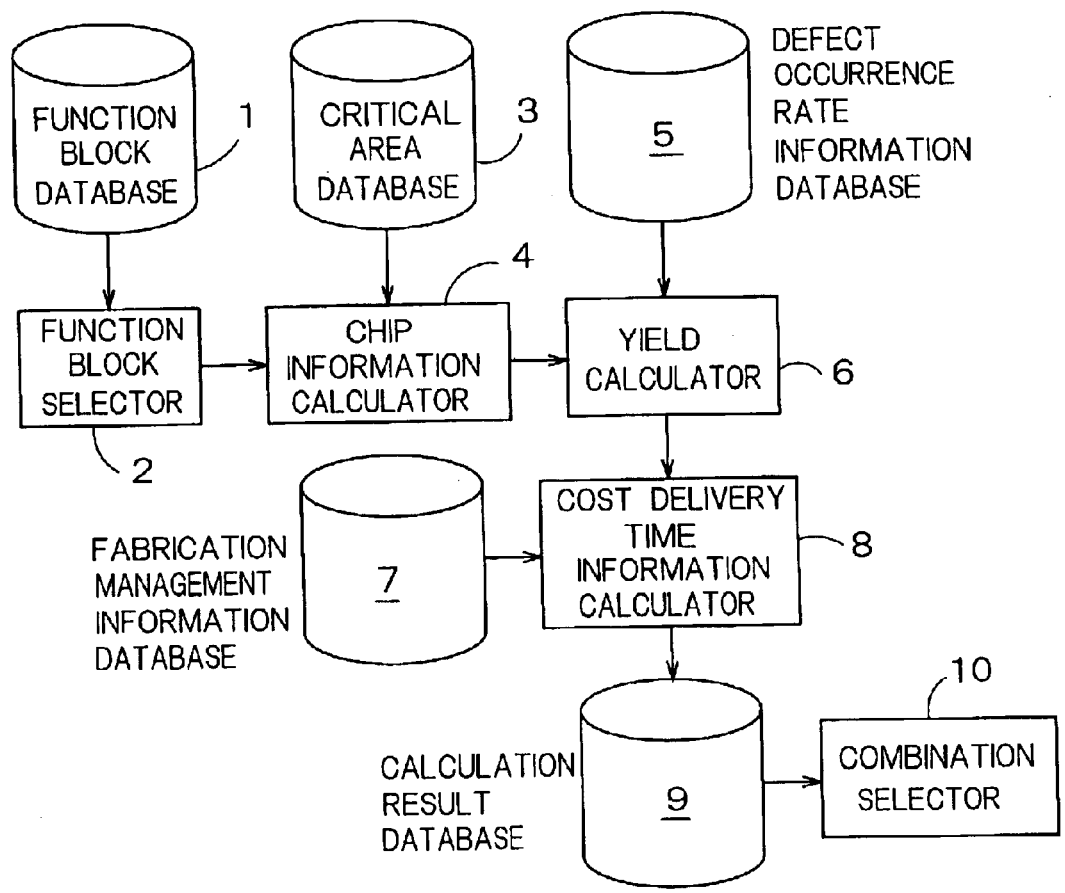
FIG. 1 is a block diagram showing schematic configuration of a semiconductor design fabrication system according to a first embodiment of the present invention.

FIG. 1 is a block diagram showing schematic configuration of a semiconductor design/fabrication system according to a first embodiment of the present invention. The semiconductor/fabrication system of FIG. 1 has a function block database 1, a function block selector 2, a critical area database 3, a chip information calculator 4, a defect occurrence rate information database 5, an yield calculator 6, a fabrication management information database 7, a cost deliver time information calculator 8, a calculation result database 9 and a combination selector 10.

The function block database 1 stores a plurality of function blocks capable of arbitrarily selecting the function blocks and arranging the function blocks on the chip. Here, the function blocks expresses circuit modules in which operational verification has already been done. Various types of the function blocks are stored in the function block database 1.

Figure 2:
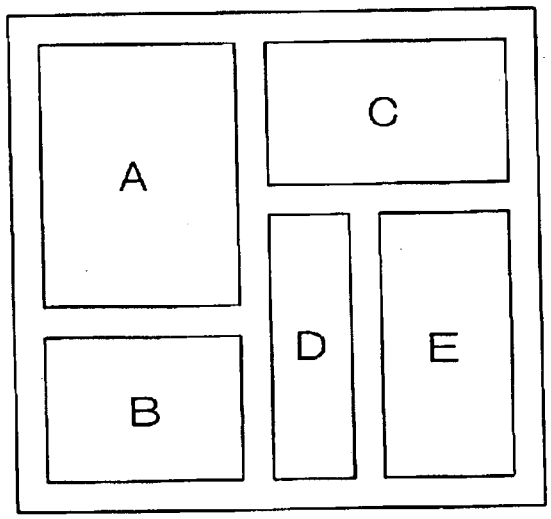
FIG. 2 is a diagram explaining the function blocks.

The function block selector 2 selects the function blocks to be arranged on the same chip from a plurality of function blocks. For example, FIG. 2 shows an example in which the function blocks A–E are selected and arranged on the chip.

Figure 3:
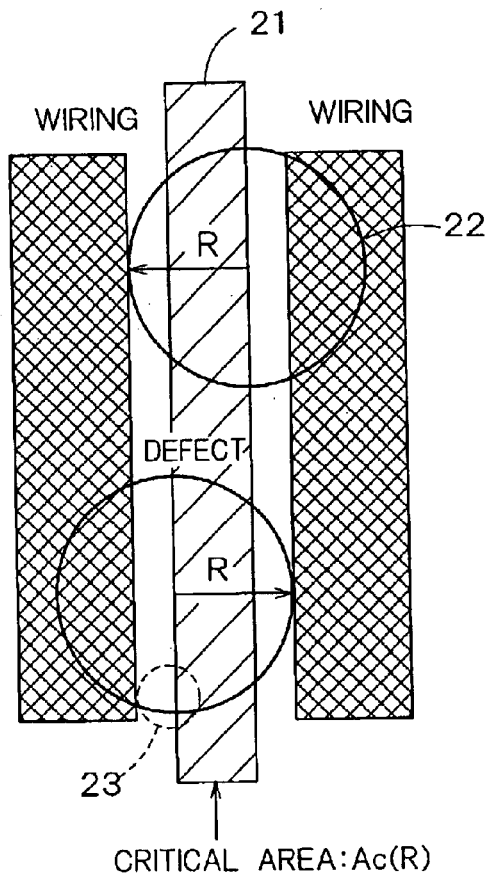
FIG. 3 is a diagram explaining the critical area.

The critical area database 3 stores critical area information on each of a plurality of function blocks. Here, the critical area expresses a range where the defective products occur due to the occurrence of the defect. For example, the shaded area 21 of FIG. 3 shows the critical area. When the center of the defect 22 of circle shape exists in the shaded area, this defect cuts across two wirings adjacent to each other, and the wirings become conductive. On the other hand, the defect 23 (shown in a dotted line of FIG. 3) of smaller size than that of the defect 22 does not cut across two wirings even if the center of the defect 23 exists in the shaded area. Thus, the critical area changes by the layout pattern and the defective size.

Figure 4:
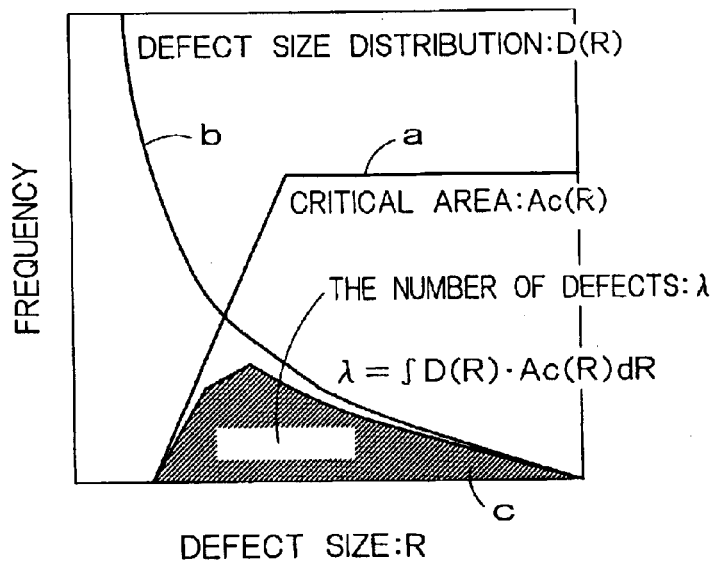
FIG. 4 is a diagram showing a relationship between the defective size and frequency.

The curve "a" of FIG. 4 is a diagram showing a relationship between the defective size and the size of the critical area. As shown in FIG. 4, the larger the defective size is, the larger the critical area is. However, when the defective size exceeds a prescribed threshold value, the critical area becomes constant.

The chip information calculator 4 of FIG. 1 calculates the chip size corresponding to total area of the selected function block, the total number of the chips per one wafer, and the total critical area of the selected function blocks. The critical area is read out from the critical area database 3.

The defect occurrence rate information database 5 stores the defect occurrence rate information for each fabrication line. The yield calculator 6 calculates the number of the non-defective chips per one wafer based on a calculation result of the chip information calculator 4 and the defect occurrence rate information on each of the fabrication lines. The defect occurrence rate on each of the fabrication lines is read out from the defect occurrence rate information database 5.

The fabrication management information database 7 stores the fabrication management information relating to fabrication cost and fabrication period on each of the fabrication lines. The cost delivery time information calculator 8 calculates information relating to the fabrication cost and the deliver time of the chips based on a calculation result of the yield calculator 6 and the fabrication management information relating to cost and delivery time on each of the fabrication lines. The fabrication management information is read out form the fabrication management information database 7.

The calculation result database 9 stores a calculation result of the cost delivery time information calculator 8. The combination selector 10 selects an optimum combination of the function blocks constituting the chip based on the information relating to the fabrication cost and the delivery time of the chip calculated by the cost delivery time information calculator 8 with regard to each of a plurality of chips composed of combinations of the function blocks different from each other.

Figure 5:
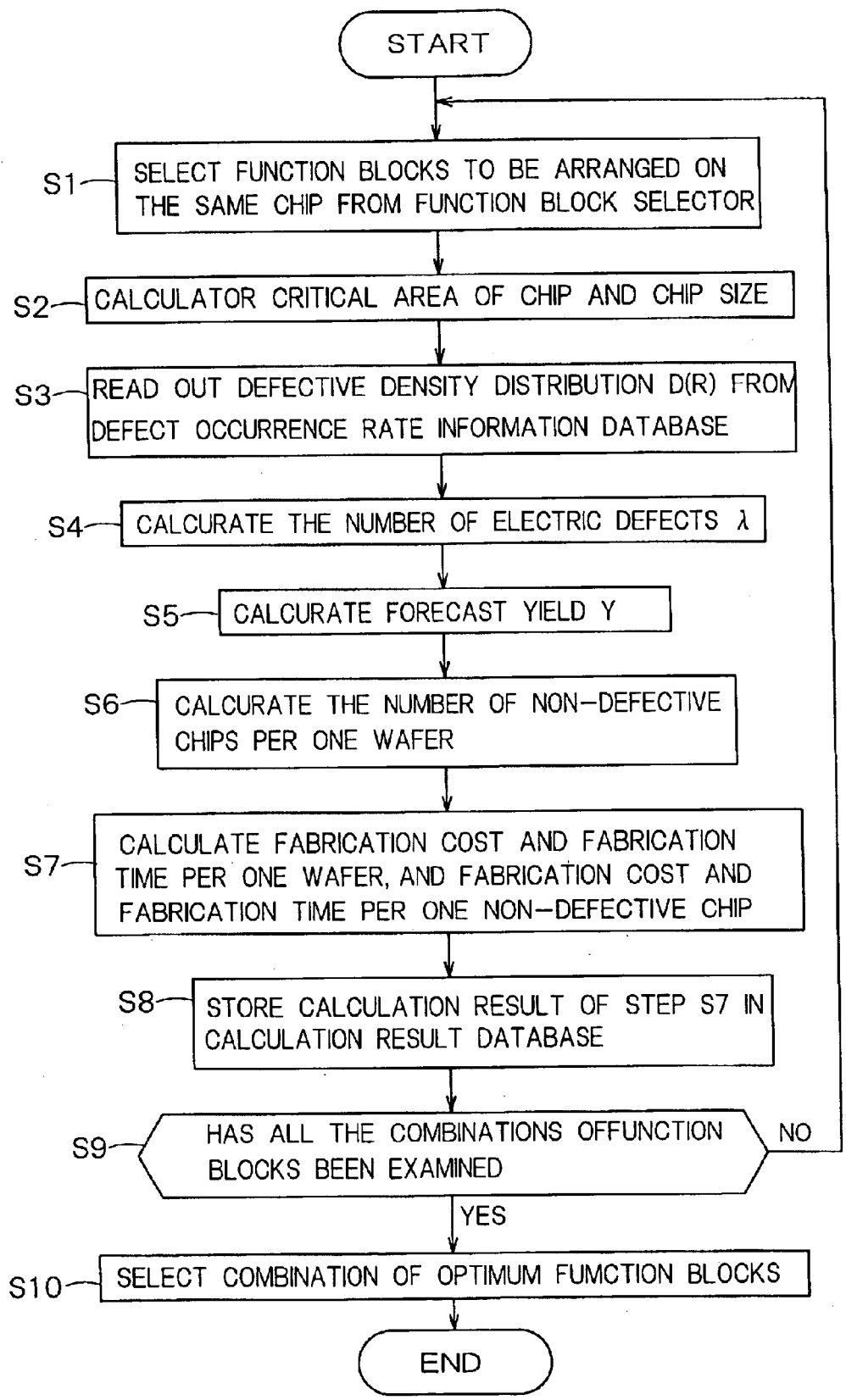
FIG. 5 is a flowchart showing procedure of the semiconductor design/fabrication system of FIG. 1.

FIG. 5 is a flowchart showing procedure of the semiconductor design/fabrication system of FIG. 1. First of all, the function blocks to be arranged on the same chip is selected from the function block selector 2 (step S1). FIG. 6 shows an example of selection of the function blocks. In the example, the block A2 is selected from the blocks A1–A5 which are candidates of the function block A, the block B3 is selected from the blocks B1–B4 which are candidates of the function block B, the block C4 is selected from the blocks C1–C6 which are candidates of the function block C, the block D7 is selected from the blocks D1–D7 which are candidates of the function block D, the block E2 is selected from the blocks E1–E3 which are candidates of the function block E, and the selected blocks are arranged at the shown locations of the chip, respectively.

When the processing of step S1 of FIG. 5 is finished, the chip information calculator 4 reads out the critical area on each of the selected function blocks from the critical area database 3, and add up these critical areas in order to calculate the critical area of the chip. Furthermore, the chip information calculator 4 calculates the chip size and the total number of the chip per one wafer based on the area on each of the selected function blocks (step S2).

Next, the yield calculator 6 reads out from the defect occurrence rate information database 5, a defective density distribution D(R) of the adopted fabrication line, which is already known, as shown in a curb "b" of FIG. 4 (step S3).

Next, the yield calculator 6 calculates the number of electric defects α in accordance with the following equation (1) based on the defect occurrence distribution D(R) read out from step S3 and the critical area Ac(R) of the chip calculated by step S2 (step S4). The number of electric defect is shown in a shaded area "c" of FIG. 4.

$$\lambda = \int Ac(R).D(R)dR \quad (1)$$

Next, the yield calculator 6 calculates a forecast yield Y (step S5). Here, for example, by presuming Poisson distribution, the forecast yield Y is calculated based on the following equation (2).

$$Y = exp(-\lambda) \quad (2)$$

Next, the yield calculator 6 calculates the number of the non-defective chip count per one wafer based on the total number of the chips and the forecast yield per one wafer prescribed from the chip size (step S6).

Furthermore, in step S6, the cost delivery time information calculator 8 may calculate the number of the non-defective chips per one wafer based on the total number of the chips per one wafer calculated by the chip information calculator 4 and the forecast yield calculated by the yield calculator 6.

Next, the cost delivery time information 8 reads out fabrication cost information and fabrication period information of each fabrication step in the adopted fabrication line from the fabrication management information database 7, and calculates the fabrication cost and the fabrication time necessary for one wafer to obtain completed products, and the fabrication cost and the fabrication time per one non-defective chip (step S7).

The calculation result of step S7 is stored in the calculation result database 9 (step S8). Here, the calculation result of step S7 is categorized for each combination of the selected function blocks and stored in the calculation result database 9.

Figures 7, 8:
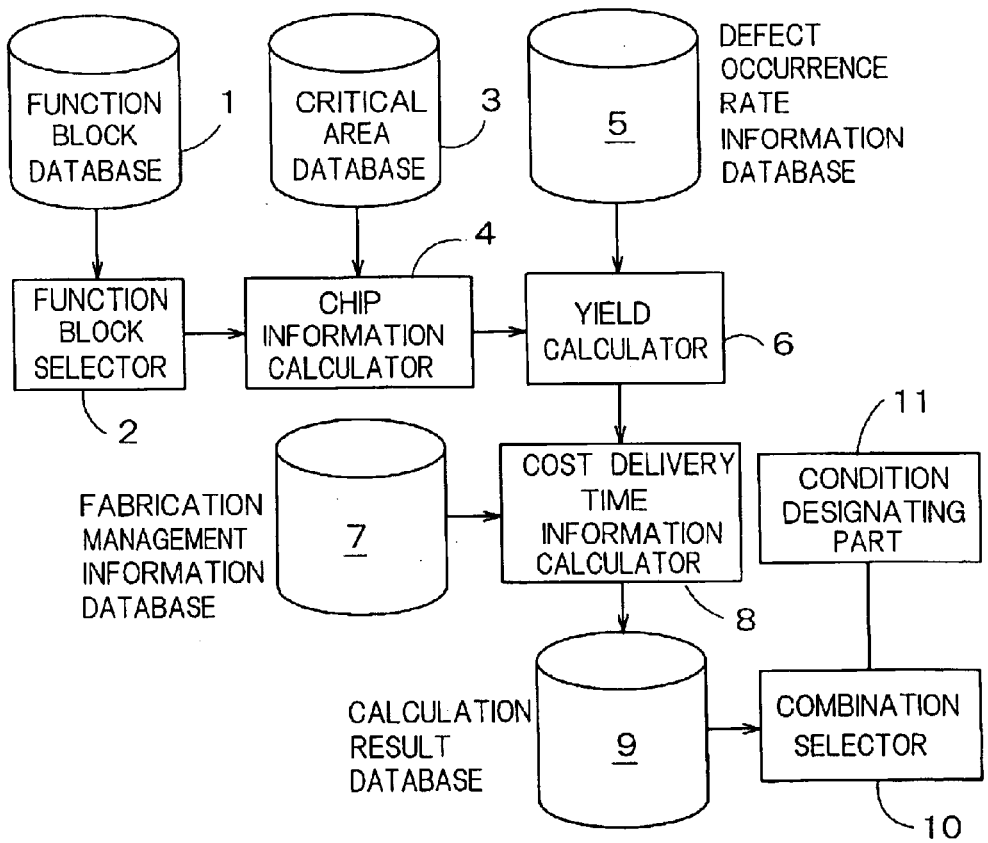
FIG. 7 is a diagram showing an example of information in the calculation result database storing the calculation result calculated by the procedure of FIG. 5.
FIG. 8 is a block diagram showing schematic configuration of a semiconductor design/fabrication system according to a second embodiment of the present invention.

FIG. 7 is a diagram showing an example of the information in the calculation result database 9. The calculation result database of FIG. 7 stores the information such as block configuration, chip size, the total number of the chips per one wafer, the number of the non-defective chips per one wafer, fabrication cost per one wafer, fabrication cost per one non-defective chip, fabrication time per one wafer, and fabrication time per one non-defective chip, for each combination of the function block.

Next, it is determined whether or not the processings of steps S1–S8 have been performed for all the combinations of the function blocks in step S9. If there is a combination of the function blocks which does not yet perform the processings, the combination of new function block is selected in step S1, and the processings after step S2 are repeated.

When the processings with regard to all the combinations are finished, the combination selector 10 selects an optimum combination of the function blocks in step S10. Because each user has the different request for the chip, the optimum combination of the function blocks is selected in conformity to user's request. The optimum combination is, for example, a combination in which the number of the non-defective chips per one wafer is the maximum, a combination in which the cost per the non-defective chip is least expensive, or a combination in which the delivery time is the shortest.

Furthermore, although not shown, the semiconductor device desired by user is designed/fabricated and is made a delivery to user based on the selected optimum combination of the function blocks. At this time, a form delivered to user may be a completed product of the semiconductor device, or design data such as software IP, firmware IP and hardware IP necessary for fabricating the completed product of the semiconductor device at user side.

Thus, according to the present embodiment, the information such as the fabrication cost and the fabrication time necessary for one wafer, and the fabrication cost and the fabrication time per one non-defective chip is calculated and compared with each other on each of the combinations of the function blocks capable of being arranged on the same chip. Because of this, it is possible to easily and quickly select the combination of the fabrication cost and the fabrication time in conformity to user's request.

Incidentally, in the above-mentioned flowchart of FIG. 5, the processings for each fabrication line are not performed. If it is possible to select either of a plurality of fabrication lines, the processings of FIG. 5 are performed for each fabrication line, the calculation result is stored in the calculation result database 9 and the optimum fabrication line may be selected from the stored calculation result. Therefore, it is possible to select the optimum combination of the function blocks at the optimum fabrication line.

(Second Embodiment)

A second embodiment selects combination of the function blocks and the fabrication line in conformity to conditions concretely designated from user in advance.

FIG. 8 is a block diagram showing schematic configuration of a semiconductor design/fabrication system according to a second embodiment of the present invention. The semiconductor design/fabrication system of FIG. 8 has a configuration in which a condition designating part 11 is newly added.

The condition designating part 11 designates fabrication condition including at least one of desirable quantity, desirable delivery time and desirable price of the chip. The combination selector 10 selects an optimum combination of the function blocks in accordance with information designated by the condition designating part 11.

The combination selector 10 selects combination of the function blocks in conformity to various conditions such as desirable quantity, desirable delivery time and desirable price designated by user in the condition designating part 11.

For example, when user desires 10,000 pieces of chip delivery at price equal to or less than 6,000 yen per one chip, if the information shown in FIG. 9 is stored in the calculation result database 9, the combination selector 10 selects "combination 3" of the fabrication line Fab. X of FIG. 9.

Thus, according to the second embodiment, the combination of the function blocks most suitable for the condition desired by user is selected. Because of this, there is no likelihood in which the chips undesirable for user are fabricated.

(Third Embodiment)

A third embodiment gives a priority order to conditions desired by user, and the combinations of the function blocks are examined in the order of descending priorities.

As described in the second embodiment, when the combination of the function blocks in conformity to the condition desired by user is selected, there is a likelihood in which the combination in conformity to the condition desired by user is not found, or a plurality of combinations which are desired by user are found and it is impossible to narrow down to one condition.

FIG. 10 is a block diagram showing schematic configuration of a semiconductor design/fabrication system according to a third embodiment of the present invention. The semiconductor design/fabrication system of FIG. 10 has a configuration in which a priority designating part 12 is newly added to the configuration of FIG. 1.

The priority designating part 12 designates priority order for more than two fabrication conditions among the fabrication conditions including at least one of desirable quantity, desirable delivery time and desirable price of the chip. The combination selector 10 selects the combination of the function blocks, taking into consideration the priority order of the fabrication conditions designated by the priority designating part 12.

For example, when user designates the price equal to or less than 5,000 yen per one chip, if the information shown in FIG. 9 is stored in the calculation result database 9, the condition desired by user is assumed to be only the "combination 3" of the fabrication line Fab. Y, and this combination is selected.

Here, if user designates which of the desirable delivery time or the desirable price is prioritized in advance, the combination selector 10 selects a desirable combination, taking the priority order into consideration. For example, if user gives top priority on the desirable delivery time (for example, October 15th), and gives the next priority on the desirable price (for example, equal to or less than 5,000 yen), "combination 3" of the fabrication line Fab. X is selected. On the other hand, if user gives top priority on the desirable price (equal to or less than 5,000 yen), and gives the next priority on the desirable delivery time (October 15th), the "combination 3" of the fabrication line Fab. Y is selected.

Thus, according to the third embodiment, the priority order is set in accordance with the conditions desired by user. Because of this, undesirable situation in which the combinations of the function blocks are not narrowed down to one, or no combination of the function blocks is found, does not occur.

In the above-mentioned embodiment, as an example of the condition desired by user, the desirable quantity, the desirable delivery time, the desirable price and so on has been described. However, concrete examples of the conditions desired by user are not limited. For example, the condition relating to hardware performance such as signal propagation speed, power consumption and noise intensity may be designated.

The semiconductor design/fabrication system described in each of the above-mentioned embodiments may be composed of at least one of hardware and software. In the case composed of software, the program realizing the functions of the semiconductor design/fabrication system is contained in a recording medium such as a flexible disc or a CD-ROM in order to be read out from and to be executed by a computer. The recording medium is not limited to a portable medium such as magnetic discs or optical discs, but may be a fixed-type recording medium such as a hard disc drive or a semiconductor memory.

The program realizing the functions of the semiconductor design/fabrication system may be distributed via a communication line (including wired or wireless communication) such as an Internet. Furthermore, the program may be distributed via a wired line or a wireless line such as the Internet at a state of encoding, modulating and compressing the program. Otherwise, the program may be contained in the recording medium and be distributed.

What is claimed is:

1. A semiconductor design/fabrication system which combines a plurality of function blocks and arranges the combined function blocks on a chip, comprising:
   a function block selector which selects the function blocks to be arranged on the same chip from a plurality of function blocks for each of which a critical area indicating a range where defective products occur due to existence of defects is known;
   a chip information calculator which calculates a sum of said critical areas on each of the selected function blocks;
   an yield calculator which calculates an yield based on a calculation result of said chip information calculator and defect occurrence rate information of a chip fabrication line;
   a cost delivery time information calculator which calculates information relating to fabrication cost and delivery time of the chip based on a calculation result of said yield calculator and fabrication management information relating to cost and fabrication period of the chip fabrication line; and
   a combination selector which selects a combination of the function blocks constituting the chip based on the information relating to the fabrication cost and the delivery time of the chip calculated by said cost delivery time information calculator.

2. The semiconductor design/fabrication system according to claim 1, further comprising:
   a critical area storing part which stores said critical area information on each of said plurality of function blocks;
   a defect occurrence rate information storing part which stores the defect occurrence rate information of said chip fabrication line;
   a fabrication management information storing part which stores the fabrication management information relating to the cost and the fabrication period of said chip fabrication line; and
   a calculation result storing part which stores a calculation result calculated by said cost delivery time information calculator,
   wherein said chip information calculator calculates a sum of said critical areas of the selected function blocks based on said critical area information stored in said critical area storing part;
   said yield calculator calculates the yield based on the calculation result of said chip information calculator and said defect occurrence rate information stored in said defect occurrence rate information storing part;
   said cost delivery time information calculator calculates the information relating to the fabrication cost and the delivery time of the chip based on the calculation result of said yield calculator and the fabrication management information stored in said fabrication management information storing part; and
   said combination selector selects the combination of the function blocks constituting the chip based on the information stored in said calculation result storing part.

3. The semiconductor design/fabrication system according to claim 2,
   wherein said defect occurrence rate information storing part stores the defect occurrence rate information on each of a plurality of fabrication lines;
   said fabrication management information storing part stores the fabrication management information on each of a plurality of fabrication lines;
   said cost delivery time information calculator calculates the information relating to the fabrication cost and the delivery time of the chip on each of a plurality of fabrication lines; and
   said combination selector selects an optimum combination of the function blocks constituting the chip at an optimum fabrication line.

4. The semiconductor design/fabrication system according to claim 1, wherein said combination selector selects the combination of the function blocks with which the number of non-defective chips per one wafer is the maximum.

5. The semiconductor design/fabrication system according to claim 1, wherein said combination selector selects the combination of the function blocks with which the fabrication cost per one non-defective chip is the minimum.

6. The semiconductor design/fabrication system according to claim 1, wherein said combination selector selects the combination of the function blocks with which the fabrication period per one non-defective chip is the shortest.

7. The semiconductor design/fabrication system according to claim 1, further comprising a condition designating part which designates a fabrication condition including at least one of desirable quantity, desirable delivery time and desirable price of the chip,
   wherein said combination selector selects the combination of the function blocks satisfying the designated fabrication condition.

8. The semiconductor design/fabrication system according to claim 1, further comprising a priority order designating part which designates the order of priority with regard to a plurality of fabrication conditions including at least one of desirable quantity, desirable delivery time and desirable price of the chip,
   wherein said combination selector selects the combination of the function blocks, taking the designated order of priority into consideration.

9. The semiconductor design/fabrication system according to claim 1,
   wherein said function block selector selects a plurality of combinations of the function blocks to be arranged on the same chip; and
   said chip information calculator, said yield calculator and said cost delivery time information calculator repeatedly perform the respective calculations in accordance with a selection result of said function block selector.

10. A semiconductor design/fabrication method which combines a plurality of function blocks and arranges the combined function blocks on a chip, comprising:
    selecting the function blocks to be arranged on the same chip from a plurality of function blocks for each of which a critical area indicating a range where defective products occur due to existence of defects is known;
    calculating a sum of said critical areas on each of the selected function blocks;
    calculating an yield based on the calculated sum of said critical areas and defect occurrence rate information of a chip fabrication line;

calculating information relating to fabrication cost and delivery time of the chip based on the calculated yield and fabrication management information relating to cost and fabrication period of the chip fabrication line; and selecting a combination of the function blocks constituting the chip based on the calculated information relating to the fabrication cost and the delivery time of the chip.

11. The semiconductor design/fabrication method according to claim 10, wherein when the yield is calculated and when the information relating to the fabrication cost and the delivery time of the chip is calculated, the yield on each of a plurality of fabrication lines, and the information relating to the fabrication cost and the delivery time of the chip on each of said plurality of fabrication lines are calculated based on the defect occurrence rate information on each of said plurality of fabrication lines and the fabrication management information relating to cost and fabrication period on each of said plurality of fabrication lines; and when said combination is selected, an optimum combination of the function blocks constituting the chips at an optimum fabrication line is selected.

12. The semiconductor design/fabrication method according to claim 10, wherein when the combination is selected, a combination of the function blocks with which the number of non-defective chips per one wafer is the maximum, is selected.

13. The semiconductor design/fabrication method according to claim 10, wherein when the combination is selected, a combination of the function blocks with which the fabrication cost per one non-defective chip is the minimum, is selected.

14. The semiconductor design/fabrication method according to claim 10, wherein when the combination is selected, a combination of the function blocks with which the fabrication period per one non-defective chip is the shortest, is selected.

15. The semiconductor design/fabrication method according to claim 10, wherein when the combination is selected, a combination of the function blocks satisfying a designated fabrication condition including at least one of desirable quantity, desirable delivery time and desirable price of the chip, is selected.

16. The semiconductor design/fabrication method according to claim 10, wherein when the combination is selected, a combination of the function blocks is selected, taking into consideration the order of priority designated with regard to a plurality of fabrication conditions including at least one of desirable quantity, desirable delivery time and desirable price of the chip.

17. The semiconductor design/fabrication method according to claim 10, wherein a calculation of the sum of said critical areas, a calculation of the yield and a calculation of the information relating to the fabrication cost and the delivery time of the chip are performed for each of a plurality of combinations of the function blocks to be arranged on the same chip.

18. A semiconductor design/fabrication program to be executed by a computer, which combines a plurality of function blocks and arranges the combined function blocks on a chip, said program comprising:

a command for selecting the function blocks to be arranged on the same chip from a plurality of function blocks for each of which a critical area indicating a range where defective products occur due to existence of defects is known;

a command for calculating a sum of said critical areas on each of the selected function blocks;

a command for calculating an yield based on the calculated sum of said critical areas and defect occurrence rate information of a chip fabrication line;

a command for calculating information relating to fabrication cost and delivery time of the chip based on the calculated yield and fabrication management information relating to cost and fabrication period of the chip fabrication line; and a command for selecting a combination of the function blocks constituting the chip based on the calculated information relating to the fabrication cost and the delivery time of the chip.

19. The semiconductor design/fabrication program according to claim 18, wherein when the yield is calculated and when the information relating to the fabrication cost and the delivery time of the chip is calculated, the yield on each of a plurality of fabrication lines, and the information relating to the fabrication cost and the delivery time of the chip on each of said plurality of fabrication lines are calculated based on the defect occurrence rate information on each of said plurality of fabrication lines and the fabrication management information relating to cost and fabrication period on each of said plurality of fabrication lines; and when said combination is selected, an optimum combination of the function blocks constituting the chips at an optimum fabrication line is selected.

20. The semiconductor design/fabrication program according to claim 18, wherein a calculation of the sum of said critical area, a calculation of the yield and a calculation of the information relating to the fabrication cost and the delivery time of the chip are performed for each of a plurality of combinations of the function blocks to be arranged on the same chip.

* * * * *